United States Patent
Yamakawa et al.

(10) Patent No.: US 6,621,173 B1
(45) Date of Patent: Sep. 16, 2003

(54) SEMICONDUCTOR DEVICE HAVING AN ADHESIVE AND A SEALANT

(75) Inventors: Kimio Yamakawa, Chiba Prefecture (JP); Minoru Isshiki, Chiba Prefecture (JP); Yoshiko Otani, Chiba Prefecture (JP); Katsutoshi Mine, Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 09/483,752

(22) Filed: Jan. 14, 2000

Related U.S. Application Data

(63) Continuation-in-part of application No. 09/121,754, filed on Jul. 23, 1998, now abandoned.

(51) Int. Cl.$^7$ .......................... H01L 23/28; H01L 23/29; H01L 23/48; H01L 23/52; H01L 29/40
(52) U.S. Cl. .................. 257/788; 257/787; 257/789; 257/782; 257/783; 257/795; 257/690; 257/790; 257/791
(58) Field of Search .................. 257/778, 787–790, 257/795, 780, 791, 737, 782, 783

(56) References Cited

U.S. PATENT DOCUMENTS

| | | | |
|---|---|---|---|
| 4,812,897 A | | 3/1989 | Narita et al. ................. 357/72 |
| 4,933,744 A | * | 6/1990 | Segawa et al. ............... 357/72 |
| 5,043,793 A | | 8/1991 | Gootzen et al. .............. 357/72 |
| 5,171,716 A | | 12/1992 | Cagan et al. ................. 437/211 |
| 5,324,888 A | * | 6/1994 | Tyler et al. .................. 174/54.2 |
| 5,349,240 A | | 9/1994 | Narita et al. ................. 257/791 |
| 5,629,566 A | * | 5/1997 | Doi et al. .................... 257/789 |
| 5,959,362 A | * | 9/1999 | Yoshino ...................... 257/778 |
| 6,265,782 B1 | * | 7/2001 | Yamamoto et al. ......... 257/783 |

FOREIGN PATENT DOCUMENTS

| | | | |
|---|---|---|---|
| EP | 0 469 614 A1 | 2/1992 | ........... H01L/21/60 |
| JP | 6-504408 | 5/1994 | ........... H01L/21/60 |
| JP | 8-504063 | 4/1996 | ........... H01L/23/12 |
| WO | WO 92/05582 | 4/1992 | ........... H01L/23/12 |
| WO | WO 95/08856 | 3/1995 | ........... H01R/43/00 |

* cited by examiner

*Primary Examiner*—Tom Thomas
*Assistant Examiner*—Nitin Parekh
(74) *Attorney, Agent, or Firm*—Larry A. Milco; Catherine U. Brown

(57) ABSTRACT

A semiconductor device having a semiconductor chip; a semiconductor chip attachment element facing the semiconductor chip, at least one interconnect on the surface of the semiconductor chip attachment element; and at least one member consisting of a metal or metal alloy that electrically connects the semiconductor chip with the interconnects; wherein the semiconductor chip is bonded to the semiconductor chip attachment element by an adhesive and at least a portion of at least one member that electrically connects the semiconductor chip with at least one interconnect is sealed or imbedded with a sealant/filling agent, and the complex modulus of at least one of the adhesive and the sealant/filling agent is not greater than $1 \times 10^8$ Pa at $-65°$ C. and a shear frequency of 10 Hz.

25 Claims, 2 Drawing Sheets

SEMICONDUCTOR DEVICE HAVING AN ADHESIVE AND A SEALANT

This application is a continuation-in-part of application Ser. No. 09/121,754 filed Jul. 23, 1998 now abandoned.

FIELD OF THE INVENTION

This invention relates to semiconductor devices. More particularly, this invention relates to semiconductor devices in which the semiconductor chip is bonded by adhesive to a chip attachment element and at least a portion of the member that electrically connects said chip with the interconnects on said chip attachment element is sealed or embedded with a sealant/filling agent.

BACKGROUND OF THE INVENTION

Japanese Patent Application Laid Open (PCT) Numbers Hei 6-504408 (504,408/1994) and Hei 8-504063 (504,063/1996) teach semiconductor devices in which the semiconductor chip is bonded by an adhesive to a chip attachment element and at least a portion of the member that electrically connects said chip with the interconnects on said chip attachment element is sealed or embedded with a sealant/filling agent.

While semiconductor devices of this type are characterized by their potential for miniaturization and by a relatively good resistance to thermal shock, additional improvements in their thermal shock resistance are nevertheless necessary.

SUMMARY OF THE INVENTION

The inventors achieved the present invention as a result of extensive investigations into the problems discussed above.

In specific terms, the object of the present invention is to provide a semiconductor device that has an excellent resistance to thermal shock.

The present invention is directed to a semiconductor device, comprising: a semiconductor chip; a semiconductor chip attachment element facing the semiconductor chip, at least one interconnect on the surface of the semiconductor chip attachment element; and at least one member consisting of a metal or metal alloy that electrically connects the semiconductor chip with the interconnects; wherein the semiconductor chip is bonded to the semiconductor chip attachment element by an adhesive and at least a portion of at least one member that electrically connects the semiconductor chip with at least one interconnect is sealed or imbedded with a sealant/filling agent, and the complex modulus of at least one of the adhesive and the sealant/filling agent is not greater than $1\times10^8$ Pa at $-65°$ C. and a shear frequency of 10 Hz.

DETAILED DESCRIPTION OF THE INVENTION

Figure 1:
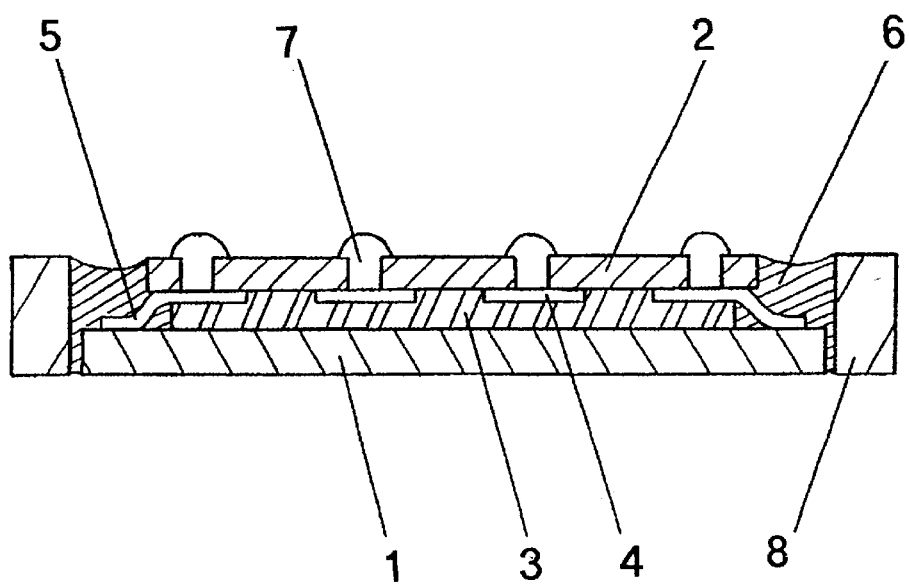
FIG. 1 contains a cross-sectional diagram of an integrated circuit that is one example of a semiconductor device according to the present invention.
Figure 2:
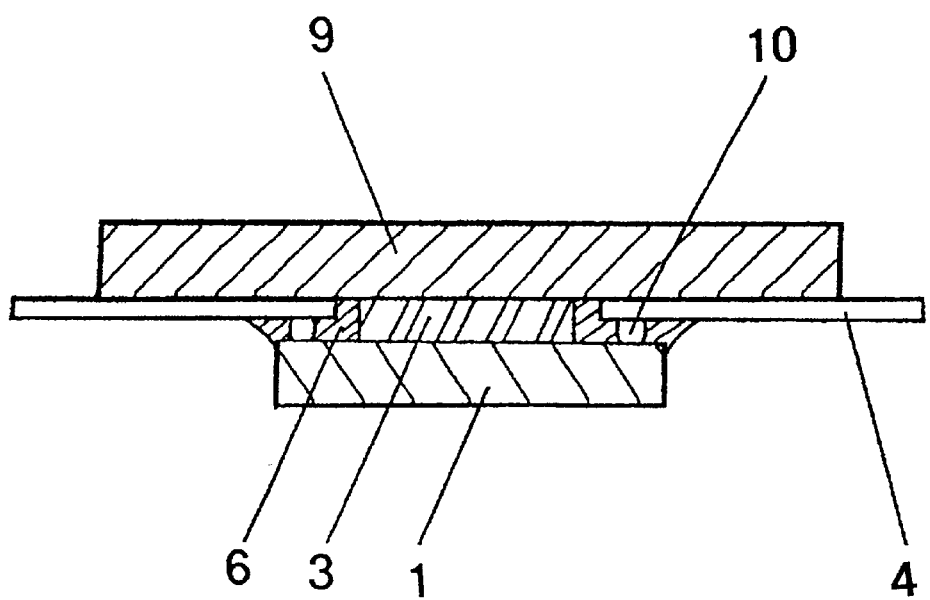
FIG. 2 contains a cross-sectional diagram of an integrated circuit that is one example of a semiconductor device according to the present invention.

The semiconductor device according to the invention will be explained in detail. The semiconductor device according to the present invention comprises a semiconductor device in which the semiconductor chip is bonded by an adhesive to a chip attachment element and at least a portion of the member that electrically connects said chip with the interconnects on said chip attachment element is sealed or embedded with a sealant/filling agent. The semiconductor device according to the present invention can be exemplified by integrated circuits (ICs), large-scale integrated circuits (LSIs), and very large-scale integrated circuits (VLSIs). The semiconductor devices in FIGS. 1 and 2 are provided as examples of the semiconductor devices under consideration. The semiconductor device according to the present invention will be explained in detail in the following with reference to these figures.

In the semiconductor device shown in FIG. 1, a semiconductor chip 1 faces a semiconductor chip attachment element 2 (a chip carrier in FIG. 1) and is bonded thereto by adhesive 3. Interconnects 4 are formed on the surface of the semiconductor chip attachment element 2 that faces the semiconductor chip 1, and these interconnects 4 and the semiconductor chip 1 are electrically connected by leads 5. A portion or all of the lead 5 is sealed or embedded with a sealant/filling agent 6. In order to mount the semiconductor device shown in FIG. 1 on a substrate, the semiconductor attachment element 2 is provided with solder balls 7. In addition, an outer frame 8 is provided in order to protect the semiconductor chip 1 from external mechanical stresses, but the nature of this outer frame 8 in semiconductor devices according to the present invention is not critical.

In the semiconductor device shown in FIG. 2, a semiconductor chip 1 faces a semiconductor chip attachment element 9 (a circuit substrate in FIG. 2) and is bonded thereto by adhesive 3. Interconnects 4 are formed on the surface of the semiconductor chip attachment element 9 that faces the semiconductor chip 1, and these interconnects 4 and the semiconductor chip 1 are electrically connected by solder bumps 10. A portion or all of the solder bump 10 is sealed or embedded with a sealant/filling agent 6. In order to mount the semiconductor device shown in FIG. 2 on a substrate, leads are provided that electrically connect to the interconnects 4. Although not shown in FIG. 2, the semiconductor chip 1 may be sealed with a resin sealant.

Neither the semiconductor chip nor the semiconductor chip attachment element are critical for the semiconductor device according to the present invention. The subject semiconductor chip attachment element can be made of, for example, a ceramic such as alumina, glass, and the like; an organic resin such as epoxy resin, glass fiber-reinforced epoxy resin, polyimide resin, bismaleimide triazine resin, and the like; and metals such as stainless steel, copper, and the like. This element can be, for example, a rigid circuit substrate or chip carrier or a flexible circuit substrate or chip carrier. The interconnects can be formed on the surface of or within the semiconductor chip attachment element by such means as printing, vapor deposition, gluing, lamination, plating, and the like. In addition, outer connection terminals, such as a ball grid of solder balls or a pin grid, and other electrical elements and components may also be mounted or provided. The member that electrically connects the semiconductor chip with the interconnects consists of a metal or metal alloy. Examples of the member that electrically connects the semiconductor chip with the interconnects include bonding wires consisting of gold, copper or aluminum; leads consisting of gold, copper, or aluminum, and solder consisting of lead or a lead-tin alloy. In order to relax the stresses acting in this member when the semiconductor device is subjected to thermal stresses, the use is preferred for this member of curved, bent, or flexed bonding wires or leads, or of solder solder bumps made of material with a low Young's modulus.

Either or both of the adhesive bonding the semiconductor chip to its chip attachment element and the sealant/filling agent that seals or embeds the member that electrically connects the semiconductor chip with the interconnects on its chip attachment element must have a complex modulus, measured at −65° C. and a shear frequency of 10 Hz, no greater than $1\times10^8$ Pa in the semiconductor device according to the present invention. The value of this complex modulus is preferably in the range from $1\times10^4$ Pa to $1\times10^8$ Pa and more preferably is in the range from $1\times10^6$ Pa to $1\times10^8$ Pa. The reason for specifying this range is that a semiconductor device fabricated using adhesive or sealant/filling agent with a complex modulus outside the specified range at −65° C. and a shear frequency of 10 Hz suffers from a reduced resistance to thermal shock. When a semiconductor device fabricated using such an adhesive or sealant/filling agent is subjected to thermal shock, the stresses generated by expansion and contraction due to differences in the thermal expansion coefficients among the semiconductor chip, its attachment element, and other structural members ultimately cause deformation and debonding of the members electrically connecting the semiconductor chip with the interconnects on its attachment element and warpage, deformation, and cracking of the semiconductor chip and hence in the reduced resistance to thermal shock. The complex modulus of the adhesive and sealant/filling agent at −65° C. and a shear frequency of 10 Hz can be determined by measurement on a strip or disk of the adhesive or sealant/filling agent using a dynamic viscoelastic test instrument.

The adhesive composition that forms the adhesive under consideration can be exemplified by epoxy system adhesive compositions such as epoxy resin adhesive compositions, silicone-modified epoxy resin adhesive compositions, and the like; silicone system adhesive compositions such as silicone adhesive compositions, epoxy-modified silicone adhesive compositions, acrylic-modified silicone adhesive compositions, polyimide-modified silicone adhesive compositions, and the like; acrylic system adhesive compositions such as acrylic resin adhesive compositions, silicone-modified acrylic resin adhesive compositions, and the like; and polyimide system adhesive compositions such as polyimide resin adhesive compositions, silicone-modified polyimide resin adhesive compositions, and the like. Silicone system adhesive compositions are particularly preferred. In order to bond the semiconductor chip to its chip attachment element, the adhesive composition preferably takes the form of a liquid of suitably high viscosity, a grease, or a paste, or a sheet or film made of a B-stage adhesive or a hot-melt adhesive. The semiconductor chip can be bonded to its chip attachment element using the subject adhesive composition by, for example, heating the adhesive composition with a hot air current or thermal radiation, bringing the adhesive composition into contact with moist air, or irradiating the adhesive composition with UV radiation or an electron beam. The semiconductor chip in the semiconductor device according to the present invention is preferably bonded to the chip attachment element by the adhesive composition through the thermal cure of a thermosetting adhesive composition. Heating the subject adhesive composition preferably forms a cured product that is a gel or rubber at ambient temperature, more preferably forms a cured product that is a rubber at ambient temperature, and particularly preferably forms a cured silicone that is a rubber at ambient temperature.

The sealant/filling agent composition that forms the sealant/filling agent under discussion can be exemplified by epoxy system sealant/filling agent compositions such as epoxy resin sealant/filling agent compositions, silicone-modified epoxy resin sealant/filling agent compositions, and the like; silicone system sealant/filling agent compositions such as silicone sealant/filling agent compositions, epoxy-modified silicone sealant/filling agent compositions, acrylic-modified silicone sealant/filling agent compositions, polyimide-modified silicone sealant/filling agent compositions, and the like; acrylic system sealant/filling agent compositions such as acrylic resin sealant/filling agent compositions, silicone-modified acrylic resin sealant/filling agent compositions, and the like; and polyimide system sealant/filling agent compositions such as polyimide resin sealant/filling agent compositions, silicone-modified polyimide resin sealant/filling agent compositions, and the like. Silicone system sealant/filling agent compositions are preferred. The adhesive composition and sealant/filling agent composition are both silicone systems in a particularly preferred embodiment. In order to effect sealing or embedding of the member that electrically connects the semiconductor chip with the interconnects on the chip attachment element, the sealant/filling agent composition is preferably a paste or liquid and more preferably is a liquid. The member that electrically connects the semiconductor chip with the interconnects on the chip attachment element can be sealed or embedded using the subject sealant/filling agent composition by, for example, heating the sealant/filling agent composition with a hot air current or thermal radiation, bringing the composition into contact with moist air, or irradiating the composition with UV radiation or an electron beam. Sealing or embedding with an elastic sealant/filling agent composition is preferably effected in the semiconductor device according to the present invention through the thermal cure of a thermosetting sealant/filling agent composition. Heating the subject sealant/filling agent composition preferably forms a cured product that is a gel or rubber at ambient temperature and particularly preferably forms a cured silicone that is a gel or rubber at ambient temperature.

The method for fabricating the semiconductor device according to the present invention is not critical. The semiconductor device shown in FIG. 1 can be fabricated, for example, by setting up the opposing surfaces of the semiconductor chip 1 and the chip attachment element 2 next to each other with the adhesive composition (high-viscosity liquid grease, paste, film, or sheet) sandwiched in between; curing the adhesive composition; then electrically connecting the semiconductor chip 1 and the interconnects 4 on the chip attachment element 2 with leads 5 (this connection step may also be carried out prior to curing the adhesive composition); sealing or embedding all or part of the lead 5 with a liquid sealant/filling agent composition; and subsequently curing the sealant/filling agent composition. The semiconductor device shown in FIG. 2 can be fabricated by setting up the opposing surfaces of the semiconductor chip 1 and the chip attachment element 9 next to each other with the adhesive composition (high-viscosity liquid, grease, paste, film, or sheet) sandwiched in between; curing the adhesive composition; then electrically connecting the semiconductor chip 1 and the interconnects 4 on the chip attachment element 9 with solder bumps 10 (this connection step may also be carried out prior to curing the adhesive composition); sealing or embedding all or part of the solder bump 10 with a liquid sealant/filling agent composition; and subsequently curing the sealant/filling agent composition.

The nature of the contact between the subject adhesive and sealant/filling agent in the semiconductor device according to the present invention preferably ranges from bonding per se to acceptably intimate contact. Moreover, the nature of the contact between the sealant/filling agent and the member that electrically connects the semiconductor chip and the interconnects on the chip attachment element preferably also ranges from bonding per se to acceptably intimate contact.

The adhesive and sealant/filling agent in the semiconductor device according to the present invention can be electrically conductive, semiconductive, or nonconductive, although they are preferably semiconductive or nonconductive, for example, preferably with a volume resistivity at 25° C. of at least $1\times10^8$ $\Omega\cdot$cm, when the surface of the semiconductor chip is used facing the chip attachment element.

EXAMPLES

The semiconductor device according to the present invention will be explained in greater detail through working examples. In order to measure the complex modulus of the adhesive and sealant/filling agent at –65° C. and a shear frequency of 10 Hz, a 12 mm×50 mm×2 mm strip of the cured product was prepared by heating the particular thermosetting silicone adhesive composition or thermosetting silicone sealant/filling agent composition at 150° C. for 30 minutes. The complex modulus was determined by measurement on this strip using a viscoelastic measurement instrument (a dynamic analyzer from Rheometrics, Inc.).

Semiconductors devices as shown in FIGS. 1 and 2 were fabricated as described below for use in the working examples of the invention and comparative examples.

Fabrication of the Semiconductor Devices Depicted in FIG. 1

The opposing surfaces of the semiconductor chip 1 and semiconductor chip attachment element 2 were first set up facing each other with the thermosetting silicone adhesive composition sandwiched in between, and the semiconductor chip 1 and semiconductor chip attachment element 2 were then bonded to each other by curing the adhesive composition by heating at 150° C. for 30 minutes. The semiconductor chip 1 and interconnects 4 on the semiconductor chip attachment element 2 were then electrically connected by the leads 5. Finally, each lead 5 was sealed or embedded in its entirety with the thermosetting silicone sealant/filling agent composition, and the sealant/filling agent composition was thereafter cured by heating for 30 minutes at 150° C.

Fabrication of the Semiconductor Devices Depicted in FIG. 2

The opposing surfaces of the semiconductor chip 1 and semiconductor chip attachment element 9 were first set up facing each other with the thermosetting silicone adhesive composition sandwiched in between, and the semiconductor chip 1 and semiconductor chip attachment element 9 were then bonded to each other by curing the adhesive composition by heating at 150° C. for 30 minutes. The semiconductor chip 1 and interconnects 4 on the semiconductor chip attachment element 9 were then electrically connected by the solder bumps 10. Finally, each solder bump 10 was sealed or embedded in its entirety with the thermosetting silicone sealant/filling agent composition, and the sealant/filling agent composition was thereafter cured by heating for 30 minutes at 150° C.

The thermal shock resistance of the semiconductor devices fabricated as described above was evaluated as follows.

Evaluation of the Thermal Shock Resistance of the Semiconductor Devices

Twenty semiconductor devices were submitted to thermal shock testing in which 1 cycle consisted of standing for 30 minutes at –65° C. and standing for 30 minutes at +150° C. The percentage of defective semiconductor devices was determined after 1,000 cycles and 3,000 cycles by continuity testing, using the solder balls 7 on the semiconductor chip attachment element 2 (chip carrier) in the case of semiconductor devices according to FIG. 1 and using the interconnects 4 in the case of the semiconductor devices according to FIG. 2.

The adherence between the adhesive and sealant/filling agent in the semiconductor devices was evaluated as follows.

Evaluation of the Adherence Between the Adhesive and Sealant/Filling Agent

After the semiconductor device had been subjected to 3,000 cycles in the thermal shock test, the adherence between the adhesive 3 and sealant/filling agent 6 was investigated using an optical microscope at 10×. The adhesiveness was evaluated on the following scale: +=tight bonding, Δ=partial debonding, ×=complete debonding.

Example 1

The adhesive composition used in this example was a thermosetting silicone adhesive composition grease that formed an adherent silicone rubber upon heating. This composition provided a silicone rubber that had a volume resistivity at 25° C. of $1.0\times10^{15}$ $\Omega\cdot$cm and a complex modulus of $2.0\times10^6$ Pa at –65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0\times10^{15}$ $\Omega\cdot$cm and a complex modulus of $2.0\times10^6$ Pa at –65° C. and a shear frequency of 10 Hz. This adhesive composition and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Example 2

The adhesive composition used in this example was a thermosetting silicone adhesive composition grease that formed an adherent silicone rubber upon heating. This composition provided a silicone rubber that had a volume resistivity at 25° C. of $1.0\times10^{15}$ $\Omega\cdot$cm and a complex modulus of $1.5\times10^8$ Pa at –65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0\times10^{15}$ $\Omega\cdot$cm and a complex modulus of $2.0\times10^6$ Pa at –65° C. and a shear frequency of 10 Hz. This adhesive composition and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Example 3

A sheet of semicured thermosetting silicone adhesive that formed an adherent silicone rubber upon heating was used to form the adhesive in this example. The resulting silicone rubber had a volume resistivity at 25° C. of $1.0 \times 10^{15}$ Ω·cm and a complex modulus of $2.0 \times 10^6$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive sheet and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Example 4

A sheet of semicured thermosetting silicone adhesive that formed an adherent silicone rubber upon heating was used to form the adhesive in this example. The resulting silicone rubber had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive sheet and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Example 5

The adhesive composition used in this example was a thermosetting silicone adhesive composition grease that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive composition and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

Example 6

The adhesive composition used in this example was a thermosetting silicone adhesive composition grease that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive composition and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

Example 7

A sheet of semicured thermosetting silicone adhesive that formed an adherent silicone rubber upon heating was used to form the adhesive in this example. The resulting silicone rubber had a volume resistivity at 25° C. of $1.0 \times 10^{15}$ Ω·cm and a complex modulus of $2.0 \times 10^6$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive sheet and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

Example 8

A sheet of semicured thermosetting silicone adhesive that formed an adherent silicone rubber upon heating was used to form the adhesive in this example. The resulting silicone rubber had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $2.0 \times 10^6$ Pa at −65° C. and a shear frequency of 10 Hz. This adhesive sheet and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

Comparative Example 1

A sheet of semicured thermosetting silicone adhesive that formed an adherent silicone rubber upon heating was used to form the adhesive in this comparative example. The resulting silicone rubber had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. This adhesive sheet and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Comparative Example 2

The adhesive composition used in this comparative example was a thermosetting silicone adhesive composition grease that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that cured upon heating with the formation of a silicone rubber. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. This adhesive composition and sealant/filling agent composition were used to fabricate 20 semiconductor devices as shown in FIG. 1. The resulting semiconductor devices were evaluated for thermal shock resistance and for adherence between the adhesive and sealant/filling agent. The results of these evaluations are reported in Table 1.

Comparative Example 3

A sheet of semicured thermosetting silicone adhesive that formed an adherent silicone rubber upon heating was used to form the adhesive in this comparative example. The resulting silicone rubber had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. This adhesive sheet and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

Comparative Example 4

The adhesive composition used in this comparative example was a thermnosetting silicone adhesiv e composition grease that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. The sealant/filling agent composition used to form the sealant/filling agent was a liquid thermosetting silicone sealant/filling agent composition that formed an adherent silicone rubber upon heating. This composition provided a silicone rubber that had a volume resistivity at 25° C. of $1.0 \times 10^{15}$ Ω·cm and a complex modulus of $1.5 \times 10^8$ Pa at −65° C. and a shear frequency of 10 Hz. This adhesive composition and sealant/filling agent composition were used to fabricate 20 semiconductor devices as shown in FIG. 2. The resulting semiconductor devices were evaluated for thermal shock resistance and for adherence between the adhesive and sealant/filling agent. The results of these evaluations are reported in Table 1.

TABLE 1

|  | working examples | | | | | | | | comparative examples | | | |
| --- | --- | --- | --- | --- | --- | --- | --- | --- | --- | --- | --- | --- |
|  | 1 | 2 | 3 | 4 | 5 | 6 | 7 | 8 | 1 | 2 | 3 | 4 |
| thermal shock resistance of the semiconductor devices % defective semiconductor devices after | | | | | | | | | | | | |
| 1,000 cycles | 0 | 0 | 0 | 0 | 0 | 0 | 0 | 0 | 0 | 0 | 0 | 0 |
| 3,000 cycles | 0 | 5 | 0 | 5 | 0 | 5 | 5 | 5 | 30 | 50 | 25 | 30 |
| adherence between the adhesive and sealant/filling agent | Δ | Δ | + | + | Δ | Δ | + | + | + | × | + | × |

The semiconductor device according to the present invention is characterized by an excellent resistance to thermal shock.

That which is claimed is:

1. A semiconductor device, comprising: a semiconductor chip; a semiconductor chip attachment element facing the semiconductor chip, at least one interconnect on the surface of the semiconductor chip attachment element; and at least one member consisting of a metal or metal alloy that electrically connects the semiconductor chip with the interconnects; wherein the semiconductor chip is bonded to the semiconductor chip attachment element by an adhesive and at least a portion of at least one member that electrically connects the semiconductor chip with at least one interconnect is sealed or imbedded with a sealant/filling agent, and the complex modulus of at least one of the adhesive and the sealant/filling agent is from $1 \times 10^4$ to $1 \times 10^8$ Pa at −65° C. and a shear frequency of 10 Hz.

2. The semiconductor device according to claim 1, wherein the semiconductor device is an integrated circuit, large-scale integrated circuit, or a very large-scale integrated circuit.

3. The semiconductor device according to claim 1, wherein the member that electrically connects the semiconductor chip with the interconnects is a bonding wire, a lead, or a bump.

4. The semiconductor device according to claim 1, wherein the complex modulus is from $1 \times 10^6$ to $1 \times 10^8$ Pa.

5. The semiconductor device according to claim 1, wherein the adhesive is formed from a silicone adhesive composition.

6. The semiconductor device according to claim 1, wherein the adhesive is formed from an adhesive composition, wherein the composition is a liquid, grease, paste, sheet, or film.

7. The semiconductor device according to claim 1, wherein the semiconductor chip is bonded to the semiconductor chip attachment element by thermally curing a thermosetting adhesive composition.

8. The semiconductor device according to claim 7, wherein the adhesive composition forms a cured product selected from the group consisting of a cured gel and a cured rubber.

9. The semiconductor device according to claim 8, wherein the cured product is a rubber.

10. The semiconductor device of claim 9, wherein the rubber is a cured silicone rubber.

11. The semiconductor device according to claim 1, wherein the sealant/filling agent is formed from a silicone sealant/filling agent composition.

12. The composition according to claim 1, wherein both the adhesive and the sealant/filling agent are formed from silicone compositions.

13. The semiconductor device according to claim 1, wherein the sealant/filling agent is formed from a sealant/filling agent composition, wherein the composition is a paste or a liquid.

14. The semiconductor device according to claim 13, wherein the sealant/filling agent composition is a liquid.

15. The semiconductor device according to claim 1, wherein the member that electrically connects the semiconductor chip with the interconnects is sealed or embedded by thermally curing a thermosetting sealant/filling agent composition.

16. The semiconductor device according to claim 15, wherein the sealant/filling agent composition forms a cured product selected from the group consisting of a cured gel and a cured rubber.

17. The semiconductor device according to claim 16, wherein the cured product is a silicone.

18. The semiconductor device according to claim 1, wherein the sealant/filling agent is electrically conductive, semiconductive, or nonconductive.

19. The semiconductor device according to claim 18, wherein the sealant/filling agent is semiconductive or nonconductive.

20. The semiconductor device according to claim 19, wherein the sealant/filling agent has a volume resistivity of at least $1 \times 10^8$ ohm-cm at 25° C.

21. The semiconductor device according to claim 1, wherein the adhesive is electrically conductive, semiconductive, or nonconductive.

22. The semiconductor device according to claim 21, wherein the adhesive is semiconductive or nonconductive.

23. The semiconductor device according to claim 22, wherein the adhesive has a volume resistivity of at least $1 \times 10^8$ ohm-cm at 25° C.

24. A semiconductor device comprising a semiconductor chip, a semiconductor chip attachment element facing the semiconductor chip, at least one interconnect on the surface of the semiconductor chip attachment element, and at least one member consisting of a metal or metal alloy that electrically connects the semiconductor chip with the interconnect; where the semiconductor chip is bonded to the semiconductor chip attachment element by an adhesive having a complex modulus from $1 \times 10^4$ to $1 \times 10^8$ Pa at −65° C. and a shear frequency of 10 Hz and at least a portion of at least one member that electrically connects the semiconductor chip with at least one interconnect is sealed or imbedded with a sealant/filling agent.

25. A semiconductor device comprising a semiconductor chip, a semiconductor chip attachment element facing the semiconductor chip, at least one interconnect on the surface of the semiconductor chip attachment element, and at least one member consisting of a metal or metal alloy that electrically connects the semiconductor chip with the interconnect; where the semiconductor chip is bonded to the semiconductor chip attachment element by an adhesive and at least a portion of at least one member that electrically connects the semiconductor chip with at least one interconnect is sealed or imbedded with a sealant/filling agent have a complex modulus from $1 \times 10^4$ to $1 \times 10^8$ Pa at −65° C. and a shear frequency of 10 Hz.

* * * * *